(12) United States Patent
Meguro et al.

(10) Patent No.: US 7,733,614 B2
(45) Date of Patent: Jun. 8, 2010

(54) MAGNETO-RESISTIVE HEAD HAVING A STABLE RESPONSE PROPERTY WITHOUT LONGITUDINAL BIASING AND METHOD FOR MANUFACTURING THE SAME

(75) Inventors: Kenichi Meguro, Kanagawa (JP);
Hiroyuki Katada, Kanagawa (JP);
Katsumi Hoshino, Kanagawa (JP);
Hiroyuki Hoshiya, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 685 days.

(21) Appl. No.: 11/698,251

(22) Filed: Jan. 24, 2007

(65) Prior Publication Data

US 2007/0188934 A1   Aug. 16, 2007

(30) Foreign Application Priority Data

Jan. 25, 2006   (JP) .............................. 2006-016418

(51) Int. Cl.
*G11B 5/127*   (2006.01)
(52) U.S. Cl. ................................. 360/324.12
(58) Field of Classification Search ............ 360/324.11, 360/324.12
See application file for complete search history.

(56) References Cited

U.S. PATENT DOCUMENTS

| | | | |
|---|---|---|---|
| 5,206,590 A | 4/1993 | Dieny et al. | |
| 5,408,377 A | 4/1995 | Gurney et al. | |
| 6,090,480 A | 7/2000 | Hayashi | |
| 6,101,072 A | 8/2000 | Hayashi | |
| 6,114,850 A | 9/2000 | Hayashi | |
| 6,133,732 A | 10/2000 | Hayashi | |
| 6,785,100 B2 | 8/2004 | Hiramoto et al. | |
| 7,243,412 B2 * | 7/2007 | Furukawa et al. | ........ 29/603.14 |
| 7,245,463 B2 * | 7/2007 | Gill | ........ 360/324.12 |
| 2004/0086751 A1 | 5/2004 | Hasegawa et al. | |
| 2004/0228045 A1 | 11/2004 | Hasegawa et al. | |

FOREIGN PATENT DOCUMENTS

| | | |
|---|---|---|
| JP | 04-358310 | 12/1992 |
| JP | 07-057223 | 3/1995 |

\* cited by examiner

*Primary Examiner*—Allen T Cao
(74) *Attorney, Agent, or Firm*—Townsend and Townsend and Crew LLP; Rambod Nader

(57) ABSTRACT

Embodiments in accordance with the present invention provide a method of manufacturing a magneto-resistive head which can realize high sensitivity and good linear response characteristics with low noise even if a track width becomes narrower. A uniaxial anisotropy unaffected by annealing which is due to the orientation of the crystal grain growth direction, is induced in a magnetic layer. The free magnetic layer has the synthetic antiferromagnetic construction: first magnetic layer/interlayer antiferromagnetic coupling layer/second magnetic layer, the magnitude of the antiferromagnetic coupling is adjusted, and linear response characteristics are obtained even if a longitudinal biasing field applying mechanism is not provided.

5 Claims, 14 Drawing Sheets

MAGNETO-RESISTIVE HEAD HAVING A STABLE RESPONSE PROPERTY WITHOUT LONGITUDINAL BIASING AND METHOD FOR MANUFACTURING THE SAME

CROSS-REFERENCE TO RELATED APPLICATION

The instant nonprovisional patent application claims priority to Japanese Patent Application No. 2006-016418, filed Jan. 25, 2006 and incorporated by reference herein for all purposes.

BACKGROUND OF THE INVENTION

Embodiments in accordance with the present invention relate to a magnetic head mounted in a magnetic storage system, and in particular relate to a magneto-resistive head which reads information recorded on a magnetic recording medium, and to a method of manufacturing the same.

At present, as a magneto-resistive head mounted as a read sensor in a magnetic storage system, a GMR (giant magneto-resistive) head using a spin-valve stack having a basic structure comprising a magnetic layer/nonmagnetic conductive layer/magnetic layer/antiferromagnetic layer as disclosed in JP 4(1992)-358310 A, is widely employed. In the spin-valve stack, the magnetic layer whereof the direction of magnetization is fixed unidirectionally by exchange coupling with the antiferromagnetic layer is referred to as a pinned magnetic layer, and the other magnetic layer whereof the magnetization direction can be varied freely according to an external magnetic field is referred to as a free magnetic layer.

A GMR head having a spin-valve stack uses a phenomenon whereby the electrical resistance varies according to the angle between the magnetizations of the pinned magnetic layer and the free magnetic layer, and outputs a magnetic signal as a voltage variation or current variation. Therefore, an important function of the spin-valve stack, in addition to functioning as a magnetic sensor, is to fix the direction of magnetization of the pinning layer in one direction (specifically, the direction perpendicular to the magnetic recording medium, referred to hereafter as "sensor height direction").

On the other hand, to obtain symmetrical response characteristics relative to the sign of the signal magnetic field, the magnetization of the free magnetic layer must be oriented in the track width direction when the external magnetic field is zero. Further, to obtain a good linear response with little noise, a longitudinal biasing field must be applied in the track width direction relative to the free magnetic layer so that the free magnetic layer has a single domain structure. Regarding this longitudinal biasing field, JP 7(1995)-57223 A discloses that a hard magnetic film or a film stack of a magnetic film and antiferromagnetic film is disposed at both ends of the spin-valve stack, and a longitudinal biasing field is applied to a free magnetic layer to form a single domain structure. In particular, the former is referred to as a hard bias structure, and presently accounts for most of the GMR head structures in use.

In the aforesaid GMR head, a sensor current is passed in the in-plane direction of the spin-valve stack, and the head is therefore referred to as a CIP (Current In the Plane) GMR head. A head which has still higher reading sensitivity than the CIP-GMR head is a CPP (Current Perpendicular to the Plane) GMR head or a TMR (Tunneling Magneto-Resistive) head. In both of these cases, the basic mode of operation is identical, it being required to obtain stable reading characteristics by applying a longitudinal biasing field based on a hard bias structure.

Further, U.S. Pat. No. 5,408,377 discloses a "synthetic ferrimagnetic free layer". Here, the free magnetic layer comprises a magnetic layer/interlayer antiferromagnetic coupling layer/magnetic layer, and the effective magnetization amount can be reduced by arranging the two magnetic layers to have an antiparallel alignment. In this disclosure, the two magnetic layers are given a very strong antiferromagnetic coupling, and intentionally given different magnetizations. Hence, when the signal magnetic field from the magnetic recording medium is detected, the magnetization direction can be varied while the two magnetic layers maintain an antiparallel alignment.

The longitudinal biasing field converts the free magnetic layer to a single domain structure and is effective in suppressing noise. The anisotropy field of the free magnetic layer is generally no more than 1 kA/m, and since it becomes magnetically saturated very easily, in order to obtain a linear response relative to the signal magnetic field from the magnetic recording medium, the effective anisotropy field of the free magnetic layer magnetization must be increased by applying the longitudinal biasing field. This therefore means that reading characteristic sensitivity and stability are in a trade-off relationship depending on the magnitude of the longitudinal biasing field. In other words, if the longitudinal biasing field is too strong, reading output falls, while on the other hand if the longitudinal biasing field is too weak, a sufficient single domain magnetization effect is not obtained and noise increases. Hence, in order to obtain satisfactory reading characteristics, the magnitude of the longitudinal biasing field must be optimized. In a hard bias structure, the magnitude of the longitudinal biasing field is determined by plural factors which interact in a complex way such as (1) the ratio of the magnetization amounts of the free magnetic layer and the hard magnetic film, (2) the etched shape of the spin-valve stack at the end of the track, and (3) the physical spatial relationship of the hard magnetic film relative to the free magnetic film, so it is very difficult to suppress these factors. In addition, to position the hard magnetic film, since the shield-shield spacing at the track ends increases relative to the center part, the problem of "side reading" occurs, the effective magnetic track width does not become narrower even if the physical track width is narrowed, and future high magnetic recording densities will not be achieved. This problem is particularly marked, the narrower the track becomes.

In the future, with increased surface recording density of magnetic storage systems, it is expected that as the track width becomes narrower, due to the aforesaid reason, in reading heads with a hard bias structure, it will be difficult to simultaneously achieve a high reading sensitivity and satisfactory linear response characteristics with low noise. In particular, in CPP reading heads where high reading sensitivity is expected, since an insulation film must the interposed between the spin-valve stack and the hard magnetic film, a sufficiently large longitudinal biasing field cannot be applied from the hard magnetic film and stability may be impaired.

BRIEF SUMMARY OF THE INVENTION

Embodiments in accordance with the present invention provide a method of manufacturing a magneto-resistive head which can realize high sensitivity and good linear response characteristics with low noise even if a track width becomes narrower. A uniaxial anisotropy unaffected by annealing which is due to the orientation of the crystal grain growth direction, is induced in a magnetic layer. The free magnetic layer has the synthetic antiferromagnetic construction: first magnetic layer/interlayer antiferromagnetic coupling layer/second magnetic layer, the magnitude of the antiferromagnetic coupling is adjusted, and linear response characteristics are obtained even if a longitudinal biasing field applying mechanism is not provided.

BRIEF DESCRIPTION OF THE DRAWINGS

FIG. 10 is a schematic view from a medium facing surface of a second aspect of the magneto-resistive head according to an embodiment of the present invention.

FIG. 11 is a schematic view of another method for imparting a strong uniaxial anisotropy to the free magnetic layer.

FIG. 12 is a schematic view from a medium facing surface of the second aspect having another form of the magneto-resistive head according to an embodiment of the present invention.

FIG. 13 is a view showing the relation between the anisotropy field of the free magnetic layer, and the etching time of a under layer.

FIG. 15 is a schematic view from a medium facing surface of the third aspect having another form of magneto-resistive head according to an embodiment of the present invention.

FIG. 17 is a schematic view of a read/write composite magnetic head applying an embodiment in accordance with the present invention.

FIG. 18 is a schematic view of a magnetic storage system applying an embodiment in accordance with the present invention.

DETAILED DESCRIPTION OF THE INVENTION

Figure 1:
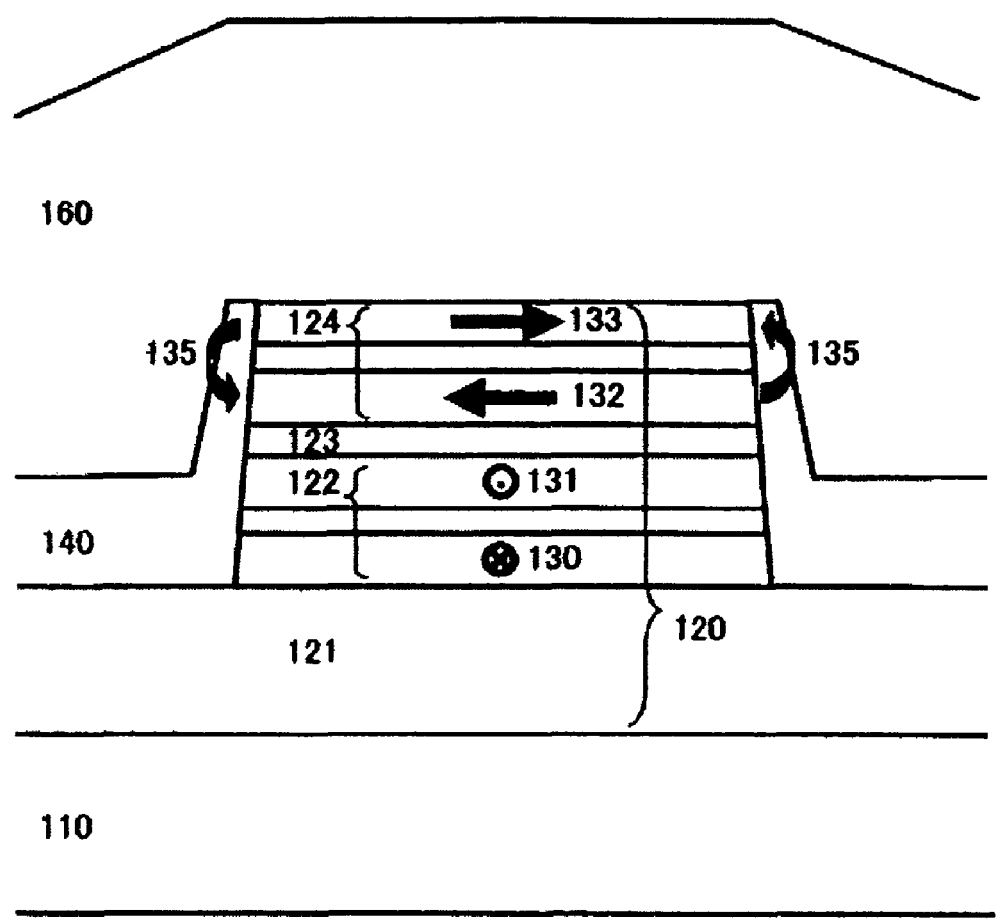
FIG. 1 is a schematic view of a first aspect of the magneto-resistive head according to an embodiment in accordance with the present invention from a medium facing surface.

It is an object of certain embodiments in accordance with the present invention to provide a magneto-resistive head which can place a free magnetic layer into a single domain state without a longitudinal biasing field applying mechanism (or, without applying a strong longitudinal biasing field), and which can achieve high reading sensitivity and reading characteristics with low noise and high reliability even if the track width becomes narrower, and to provide a method of manufacturing the same.

Considering the response characteristics of the free magnetic layer, the effect of the demagnetizing field at the track ends of the free magnetic layer is important. In general, since the free magnetic layer has an effective magnetization, magnetic poles are produced at the track ends of the free magnetic layer and are affected by the demagnetizing field. Normally, this effect is suppressed by disposing a hard magnetic film (hard bias structure) at the track ends of the free magnetic layer. Therefore, if a longitudinal biasing field applying mechanism is not provided, the free magnetic layer must be such that magnetic poles are not produced at the track ends of the free magnetic layer. This is achieved by giving the free magnetic layer the structure: magnetic field 1/interlayer magnetic field coupling layer/magnetic field 2, so that the two magnetic layers have an antiparallel alignment due to antiferromagnetic interlayer coupling via the interlayer antiferromagnetic coupling layer, and setting the magnetization amounts of the two magnetic layers to be identical. As a result, the effective magnetization amounts of the two magnetic layers cancel each other out, and the effect of the demagnetizing field can be completely eliminated. Also, the magnetization process of the free magnetic layer in this structure has a rotation magnetization mode according to the external magnetic field, wherein the magnetizations of the two magnetic layers shift between an antiparallel alignment and a parallel alignment according to the external magnetic field. The magnitude of the anisotropy field at this time is determined by the magnitude of the interlayer antiferromagnetic coupling as a predominant factor. The interlayer antiferromagnetic coupling layer is generally a Ru layer having a film thickness of about 0.3 to 0.9 nm, but in this case the antiferromagnetic coupling is too strong and high reading sensitivity is not obtained. Therefore, if for example the interlayer antiferromagnetic coupling layer is a laminated structure such as Cu/Ru or an alloy such as Ru—Cu, the dual objectives of stability and sensitivity must be achieved by adjusting the magnitude of the interlayer antiferromagnetic coupling. By adjusting the film thickness or alloy composition of the interlayer antiferromagnetic coupling layer, the magnitude of the interlayer antiferromagnetic coupling may be set as desired.

Here, in the structure disclosed in the literature (U.S. Pat. No. 5,408,377) and that of the present invention, there are at least the following differences. In the aforesaid disclosure, in the structure of the free magnetic layer: magnetic layer 1/in the coupling antiferromagnetic layer/magnetic layer 2, the magnetization amounts of the two magnetic layers are deliberately set to be different, and the interlayer antiferromagnetic coupling layer is such as to obtain a very strong interlayer antiferromagnetic coupling. As a result, the magnetization process of the free magnetic layer is completely different, and in the aforesaid disclosure, the magnetization direction of the free magnetic layer varies while the two magnetic layers maintain an antiparallel alignment relative to an external magnetic field having a magnitude of the order of the signal magnetic field from the magnetic recording medium. Also, in this case, the anisotropy field of the free magnetic layer is small, and although it is small, the demagnetizing field has an effect at the track ends, so a longitudinal biasing field applying mechanism such as a hard bias structure is required.

Further, in accordance with embodiments of the present invention, a strong uniaxial anisotropy must be induced in the free magnetic layer. This is because, in the free magnetic layer of the invention, the effective magnetization amount is approximately 0, and if the external magnetic field is 0, there is a concern that the magnetization direction of the free magnetic layer will not be uniquely determined due to the previous magnetic history. Therefore, a strong uniaxial anisotropy which has the track width direction as the axis of easy magnetization must be imparted to at least one or of the first magnetic layer and the second magnetic layer forming the free magnetic layer. In general, the free magnetic layer of the spin-valve stack is a single layer or a laminated structure having Fe, Co, Ni as principal components. Also, by forming the free magnetic layer while applying a direct current magnetic field, a uniaxial anisotropy wherein any desired direction (track width direction) is the axis of easy magnetization, can be induced in the free magnetic layer. However, the anisotropy field thus induced is no more than 1 kA/m. After forming the spin-valve stack, in order to fix the magnetization of the pinning magnetic layer in the sensor height direction by exchange coupling with the antiferromagnetic layer, annealing is generally performed while applying the magnetic field in the sensor height direction. The uniaxial anisotropy of the free magnetic layer described above is affected by this annealing, its direction may change from the track width direction to the sensor height direction, and an anisotropy dispersion may be produced which is undesirable. It may therefore be important to impart a strong uniaxial anisotropy to the free magnetic layer which is not subject to the effect of annealing. Normally, in the thin film formed by physical vapor-phase growth such as sputtering, columnar crystal grains grow in a direction perpendicular to the wafer surface. On the other hand, by giving adhering particles an orientation in the sputtering direction and forming adhering particles in an inclined direction relative to the wafer surface, crystal grains grow parallel to the incident direction of the adhering particles. At this time, if the inclined incident direction of the adhering particles is perpendicular to the track width direction, a large uniaxial anisotropy (anisotropy of 10 kA/m or more) having the track width direction as the axis of easy magnetization, can be induced. The uniaxial anisotropy thus imparted is unaffected in direction or magnitude by annealing. Therefore, by forming at least one of the first magnetic layer and second magnetic layer forming the free magnetic layer by the aforesaid method, the magnetization direction of the free magnetic layer can be fixed in the track width direction when the external magnetic field is zero, regardless of the magnetic history.

In another method of imparting a strong uniaxial anisotropy to the free magnetic layer unaffected by annealing, at least one of the surface immediately prior to forming the free magnetic layer and the topmost surface of the free magnetic layer, is formed to have a striated roughness substantially parallel to the sensor height direction. This roughness can be formed by directional controlled ion beam etching of at least one of the surface immediately prior to forming the free magnetic layer and the topmost surface of the free magnetic layer. An identical effect is obtained if the aforesaid roughness is formed in the process of forming the free magnetic layer comprising the magnetic film 1/interlayer antiferromagnetic coupling layer/magnetic layer 2, but in this case care must be taken that the antiferromagnetic coupling via the interlayer antiferromagnetic coupling layer does not deteriorate.

According to the aforesaid structure and manufacturing method, high reading sensitivity together with low noise, high reliability reading characteristics can be achieved without a longitudinal biasing field applying mechanism even if the track width becomes narrower. In this case, a hard magnetic film need not be disposed at the track ends. Therefore, the upper shield in the vicinity of the track ends may be used as a "side shield", which is also an advantage with respect to narrowing of the magnetic effective track width.

In an embodiment of the magneto-resistive head in accordance with the invention, the free magnetic layer can be placed in a single domain state without applying a longitudinal biasing field, and high reading sensitivity together with low noise, high reliability reading characteristics can be achieved even if the track width becomes narrower.

Hereafter, some embodiments of the invention will be described in further detail referring to the drawings. In certain embodiments of the present invention, the effect is the same regardless of the sensor current flow direction, i.e., in a CIP or a CPP, but here the description will focus on the CPP head structure. To simplify the description, in the following drawings, identical reference numerals are assigned to parts having an identical function.

FIG. 1 is a schematic drawing viewed from a medium facing surface of the magneto-resistive head according to a first aspect of an embodiment in accordance with the present invention. The structure of this head will now be described together with an overview of the head manufacturing sequence.

After forming a lower shield 110 on a wafer, not shown, a magneto-resistive film 120 is formed, and the track width direction is patterned to a desired shape by photolithography, ion milling or reactive ion beam etching. Next, an insulating film 140 is formed by the lift-off method at both ends of the magneto-resistive film 120. In an identical way, in the sensor height direction, the magneto-resistive film 120 is patterned to a desired shape by photolithography, ion milling or reactive ion beam etching to form the insulator film 140 by the lift-off method. Regarding the patterning of the magneto-resistive film 120, the sequence of the track width direction and sensor height direction may be reversed without any problem. Further, an upper shield 160 is formed. A pair of electrodes which pass a current in the film thickness direction of the magneto-resistive film 120 are added to the lower shield 110 and upper shield 116, and the electrical resistance variation of the magneto-resistive film 120 is detected. Also, the insulator film 140 is disposed so that the lower shield 110 and upper shield 162 do not electrically short-circuit. It is desirable that electrical contact resistance between the lower shield 110 and magneto-resistive film 120, and between the magneto-resistive film 120 and upper shield 160, is eliminated as far as possible. To reduce this effect, it is effective to first remove the surface oxidation film or surface deposits/adsorbed material by plasma etching or ion beam etching prior to forming the magneto-resistive film 120 and upper shield 160.

The basic structure of the magneto-resistive film 120 is: antiferromagnetic layer 121/pinning layer 122/intermediate layer 123/free magnetic layer 124, from the wafer side. The effect of the invention is not contravened however if the stacking order is completely reversed, i.e., free magnetic layer 124/intermediate layer 123/pinning layer 122/antiferromagnetic layer 121, from the wafer side. Also, there is no reason why a suitable under layer should not be formed as the lowermost layer, or a suitable protective layer should not be formed as the uppermost layer. More specifically, the pinning layer 122 may have a "synthetic ferrimagnetic structure" comprising a magnetic layer/interlayer antiferromagnetic coupling layer/magnetic layer. This is because, if it is a synthetic ferrimagnetic layer, the magnetization direction of the pinning layer 122 can be more firmly fixed in the sensor height direction, and also because the effective magnetization amount of the pinning layer 122 can be made very small, and the transverse biasing field relative to the free magnetic layer 124 can be reduced. The free magnetic layer 124 has the structure: first magnetic layer/interlayer antiferromagnetic coupling layer/second magnetic layer, and by arranging the magnetizations of the two magnetic layers to have an antiparallel alignment due to interlayer antiferromagnetic coupling via the interlayer antiferromagnetic coupling layer, and arranging the magnetization amounts of the two magnetic layers to be identical, the effective magnetization amounts cancel each other out. In other words, this is a "synthetic antiferromagnetic structure". In this structure, the magnetic poles at the track ends of the free magnetic layer cancel each other out, so the effect of the demagnetizing field is small.

In FIG. 1, the magnetization directions of the magnetic layers are shown by arrows. Based on this, the magnetization process and magnetization direction control of the magnetic layers, and particularly the free magnetic layer 124, will now be described briefly.

When the external magnetic field is 0, the magnetizations of the two magnetic layers forming the pinning magnetic layer 122 are fixed in the sensor height directions: 130 and 131 (which may both be reversed while maintaining an antiparallel alignment), due to the exchange coupling with the antiferromagnetic layer 121 formed adjacent to it. On the other hand, the magnetizations of the two magnetic layers forming the free magnetic layer 124 shift between an antiparallel alignment and a parallel alignment due to the rotation magnetization mode according to the external magnetic field. In order to facilitate understanding of this magnetization process, some calculation results using a coherent rotation model will be described referring to FIG. 2.

Figure 2:
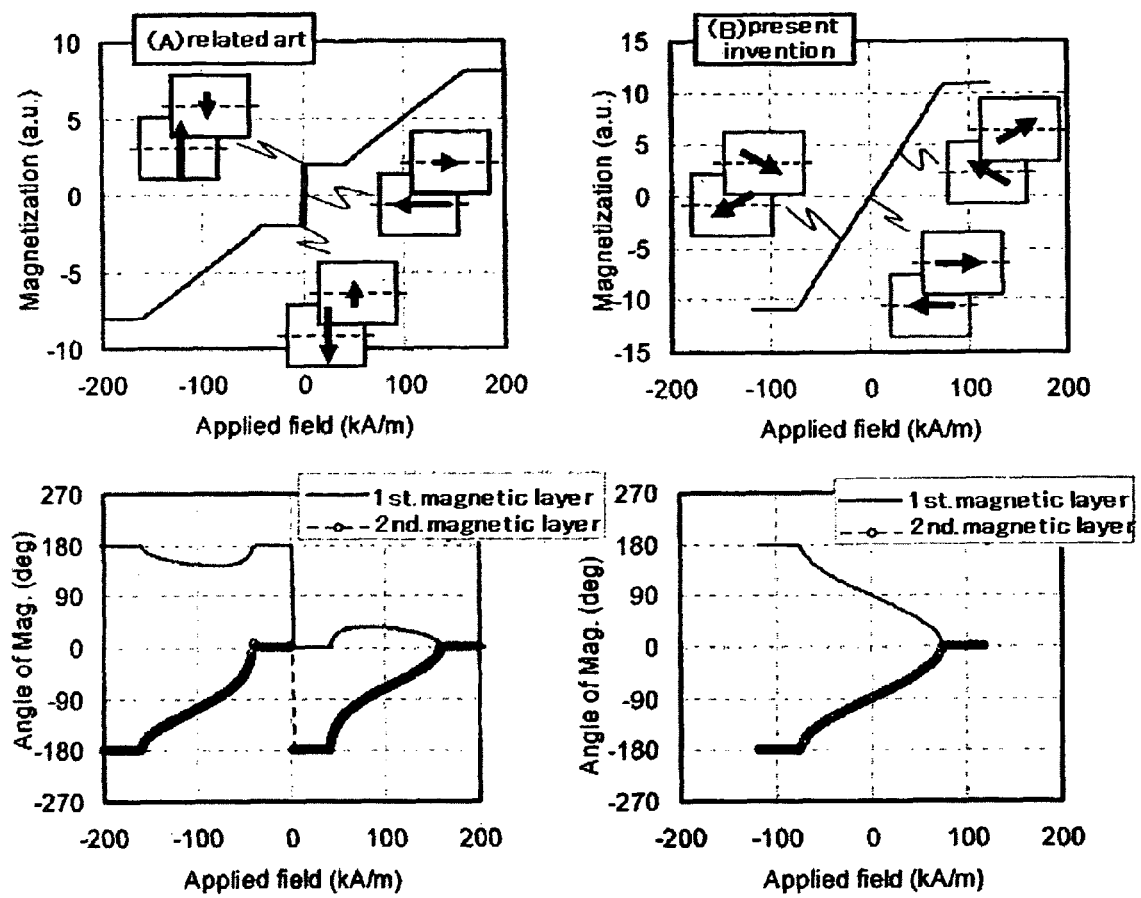
FIG. 2 is a diagram comparing the differences in a free magnetic layer magnetization process according to the prior art and according to an embodiment of the present invention.

FIG. 2 shows the M-H curve of the free magnetic layer, and the variation of magnetization angle of the first magnetic layer and second magnetic layer forming the free magnetic layer, in terms of a comparison of (A) prior art: synthetic ferrimagnetic structure, and (B) present invention: synthetic antiferromagnetic structure. Regarding the magnetization angle of the magnetic layers, 0 (±180°) corresponds to the sensor height direction, and 90° (90°) corresponds to the track width direction. In the case of (A) prior art—ferrimagnetic structure, the magnetization does not vary from the M-H curve within a magnetic field range of about ±30 kA/m excepting in the vicinity of zero field. Also, it is seen that the magnetization varies sharply in the vicinity of zero field. This suggests that, as is clear from the variation of magnetization angle, within a magnetic field range of about ±30 kA/m, the magnetizations of the first magnetic layer and second magnetic layer forming the free magnetic layer maintain an antiparallel alignment, and in the vicinity of zero field, the magnetizations of the two magnetic layers reverse while maintaining an antiparallel alignment. On the other hand, in the case of (B): present invention: synthetic antiferromagnetic structure, the M-H curve shows the linear variation until a magnetization saturation region. Looking at the variation of magnetization angle, the magnetizations of the first magnetic layer and second magnetic layer forming the free magnetic layer show a symmetrical variation according to the external magnetic field, and when the magnetizations of the two layers shift between parallel and antiparallel alignments, the magnetizations undergo a linear rotation. In practice, it is difficult to control the magnetizations of the first magnetic layer and second magnetic layer forming the free magnetic layer to be completely identical, but it was verified that provided the difference in the product of the saturation magnetic field density of the magnetic layer and its film thickness is 0.4 T·nm or less, a linear response without hysteresis is obtained.

Figure 3:
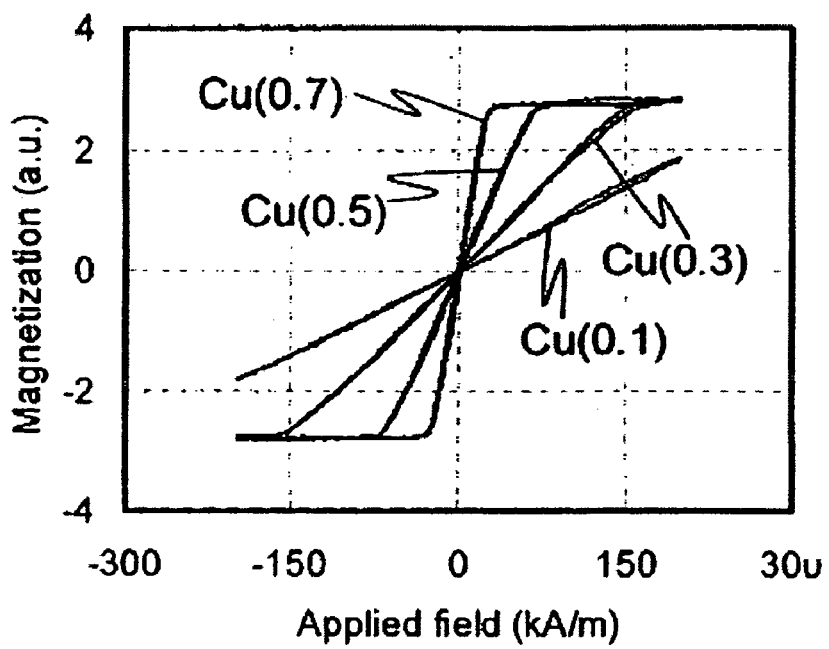
FIG. 3 is a diagram showing an M-H curve of the free magnetic layer according to an embodiment of the present invention.

The magnitude of the anisotropy field of the free magnetic layer in the present aspect is determined by the magnitude of the antiferromagnetic coupling between the first magnetic layer and second magnetic layer. The interlayer antiferromagnetic coupling layer is generally a Ru layer having a film thickness of about 0.3 to 0.9 nm, but in this case the antiferromagnetic coupling is too strong, and a high reading sensitivity is not obtained. Therefore, the interlayer antiferromagnetic coupling layer may have a laminated structure such as for example Cu/Ru, it being necessary to achieve the dual objectives of stability and sensitivity by adjusting the magnitude of the antiferromagnetic coupling. FIG. 3 shows the variation of the M-H curve when the Cu film thickness t is varied for a free magnetic layer comprising $Co_{90}Fe_{10}(3)/Cu(t)/Ru(0.8)/Co_{90}Fe_{10}(3)$. The units of film thickness are nm. It is seen that for all the M-H curves, a linear response with small hysteresis is obtained. Also, by varying the Cu film thickness, the anisotropy field may be set as desired.

Figure 4:
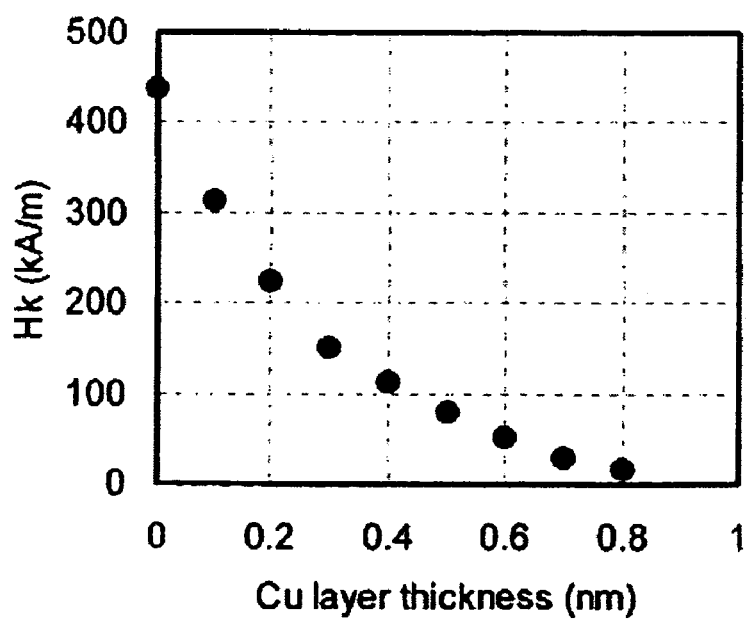
FIG. 4 is a diagram showing the dependence of the anisotropy field of the free magnetic layer on Cu film thickness according to an embodiment of the present invention.

FIG. 4 shows the dependence of the anisotropy of the free magnetic layer on the Cu film thickness estimated from the M-H curve of FIG. 3. It is seen that the anisotropy field Hk varies continuously according to the Cu film thickness. The signal magnetic field from a magnetic recording medium in the vicinity of the air bearing surface is estimated to be of the order of 20 kA/m, so in order that the free magnetic layer does not become saturated relative to the signal magnetic field, it is desirable that the Cu film thickness is 0.7 nm or less. Also, although stated in a reversed order, the Ru film thickness may be set to about 0.7 to 0.9 nm at which a stable antiferromagnetic coupling is obtained. Here, the case was described where the antiferromagnetic coupling layer was Cu/Ru, but the antiferromagnetic coupling layer may be a nonmagnetic layer selected from any of Ru, Re, Cr, Ir, or a film stack comprising a first and nonmagnetic layer selected from any of Ru, Re, Cr, Ir and a second nonmagnetic layer selected from any of Cu, Ag, Au. It may also be an alloy having at least one of the elements Ru, Re, Cr, Ir, Cu as principal component. In any case, the magnitude of the antiferromagnetic coupling may be suitably adjusted according to the film thickness and compositional optimization, it being necessary to satisfy the dual objectives of stability and sensitivity.

In the free magnetic layer structure of this aspect, the effective magnetization amount is approximately 0, so when the external magnetic field is zero, it is a concern that the magnetization direction of the free magnetic layer cannot be uniquely determined due to the previous magnetization history. Therefore, it is desirable to impart a strong uniaxial anisotropy which makes the track width direction the axis of easy magnetization, to at least one of the first magnetic layer and second magnetic layer forming the free magnetic layer. Normally, in the process for forming the magneto-resistive film 120, the film is formed while applying a direct current magnetic field of about 5 kA/m in the sensor height direction when forming the pinning layer 122, and in the track width direction when forming the free magnetic layer 124, and induce uniaxial anisotropy in a desired direction in these magnetic layers. However, the anisotropy field thus induced is no more than about 0.5 kA/m. Further, to obtain a strong exchange coupling of the magnetization of the pinning layer 122 with the antiferromagnetic layer 121 formed adjacent to it, after forming the magneto-resistive film 120, annealing (230-270° C., about several hours) is performed while applying a direct current magnetic field more than that required for magnetic saturation of the magnetization of the pinning layer 122 in the sensor height direction. The uniaxial anisotropy induced in the free magnetic layer 124 is affected by this annealing, which is undesirable from the viewpoint of controlling the magnetization direction.

Figure 5:
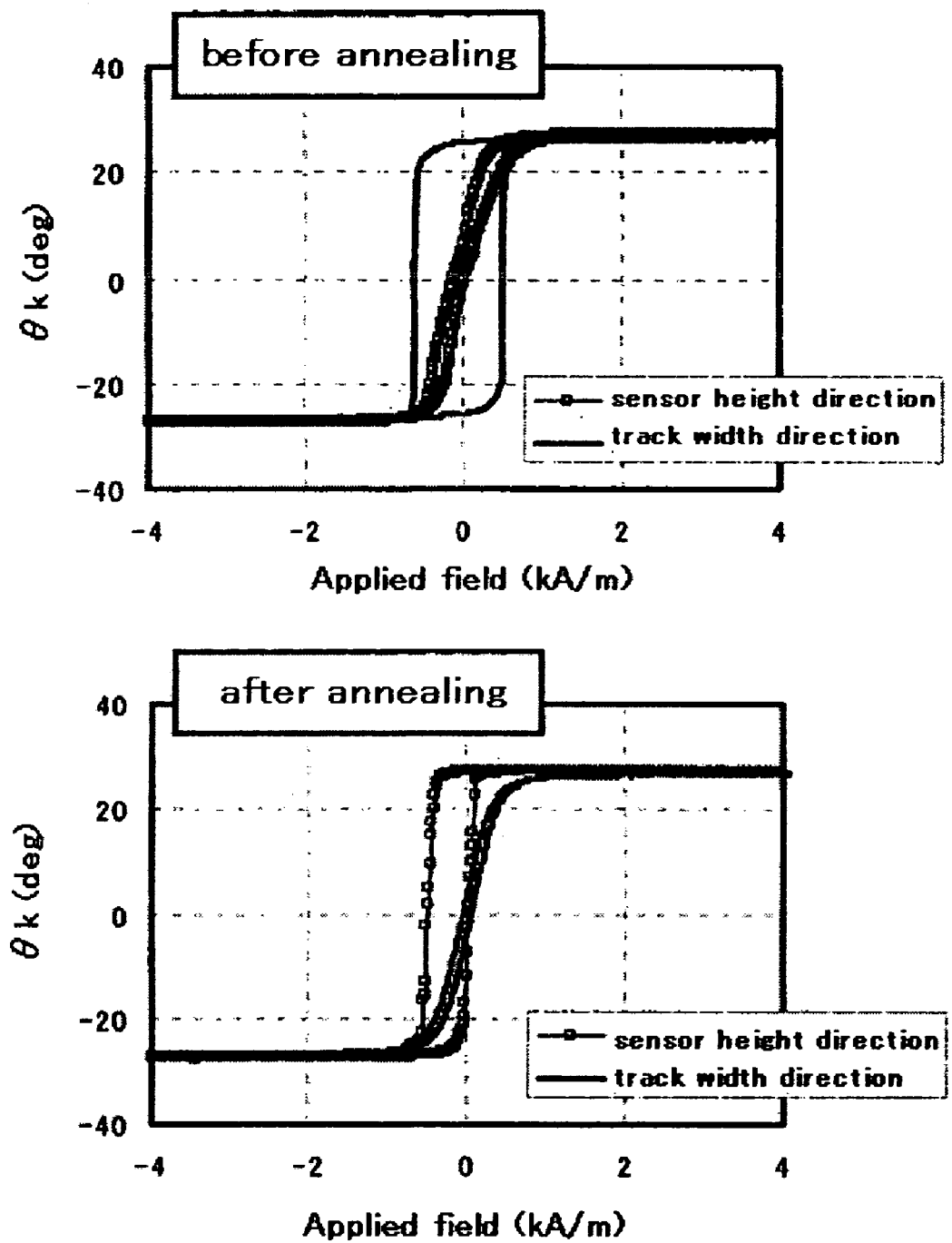
FIG. 5 is a diagram showing the effect of annealing on the uniaxial anisotropy of the conventionally formed free magnetic layer.

FIG. 5 shows the Kerr loop before and after annealing of the free magnetic layer in a spin-valve stack formed using the aforesaid usual film-forming method. The composition of the free magnetic layer was $Co_{90}Fe_{10}$ (3 nm). The annealing was performed at 270° C. for 3 hours while applying a magnetic field of 1.1 MA/m in a direction parallel to the sensor height direction in vacuo. Before and after annealing, the magnitude of the anisotropy field in the axis of difficult magnetization, was less than 1 kA/m. Also, it is seen that prior to annealing (immediately after film-forming), the track width direction was the axis of easy magnetization, whereas after annealing, the sensor height direction was the axis of easy magnetization, respectively. Therefore, in this case, the magnetization direction of the free magnetic layer did not orient in the desired direction (track width direction), which is undesirable.

Figure 6:
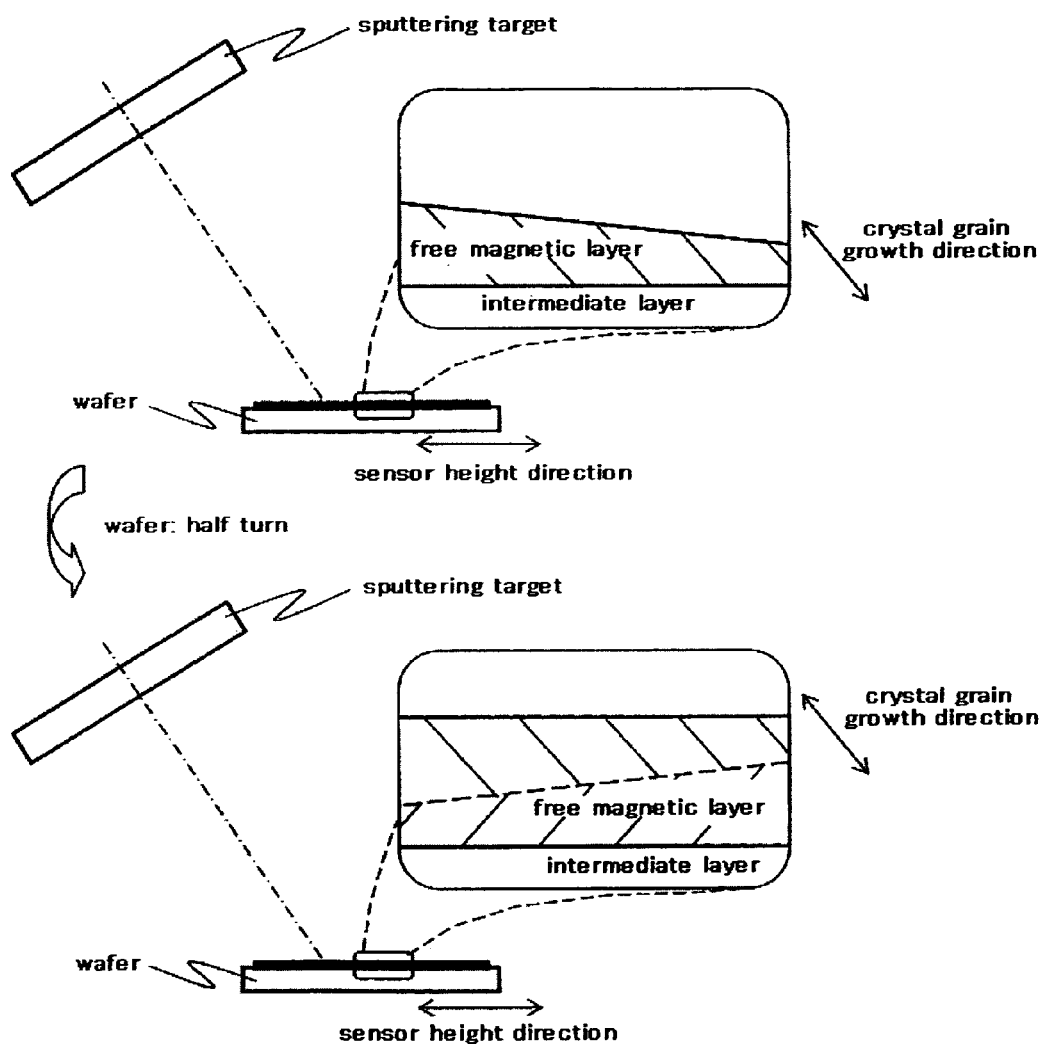
FIG. 6 is a schematic view of a method for imparting a strong uniaxial anisotropy to the free magnetic layer.

FIG. 6 is a schematic view relating to the method of forming the free magnetic layer having a strong uniaxial anisotropy. When the free magnetic layer is formed, it is desirable to give an orientation to the growth direction of the crystal grains. From this viewpoint, it is undesirable to form the spin-valve stack using a physical vapor-phase growth technique such as sputtering. The center axis (incident direction of the adhering particles) of the sputtering target is set so that it is substantially perpendicular to the track width direction and inclined with respect to the wafer surface. Due to this, the crystal grains grow parallel to the incident direction of the adhering particles. However, in this film-forming method, the film thickness of the free magnetic layer has an in-plane distribution which gradually becomes thinner from the side nearest to the side furthest from the sputtering target. Therefore, after forming half the desired film thickness in the wafer center, the wafer is given a half-turn, and the remaining half of the film thickness is then formed, thereby maintaining a uniform in-plane film thickness distribution. Of course, this is not limited to two part film-forming, and four part or six part film-forming may also be performed.

Figure 7:
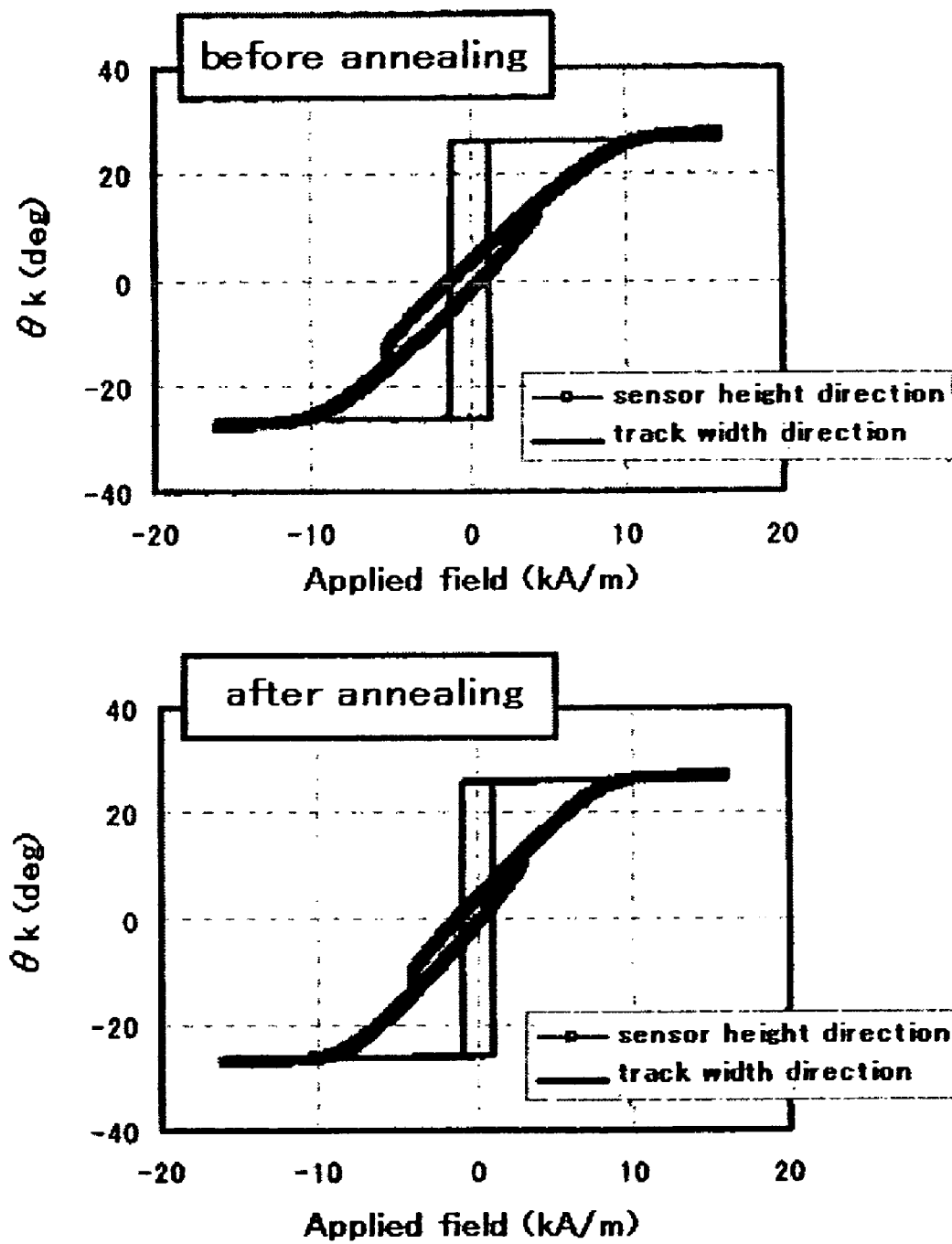
FIG. 7 is a diagram showing the effect of annealing on the uniaxial anisotropy of the free magnetic layer formed according to an embodiment of the present invention.

FIG. 7 shows the Kerr loop of a free magnetic layer of $Co_{90}Fe_{10}$ (3 nm) in a spin-valve stack formed using this film-forming method. The incident direction of the adhering particles when the free magnetic layer is formed was set to be perpendicular to the track width direction, and such that the angle with the wafer surface was 45°. As in the case of FIG. 5, a comparison is shown prior to and after annealing performed at 270° C. for 3 hours while applying a magnetic field of 1.1 MA/m in a direction parallel to the sensor height direction in vacuo. The anisotropy field in the axis of difficult magnetization was a large value of about 10 kA/m which differed by as much as one order of magnitude. It is seen that prior to annealing (immediately after film-forming) and after annealing, the track width direction is the axis of easy magnetization. Further, it is seen that the magnitude of the anisotropy field is almost no different prior to and after annealing, and the uniaxial anisotropy is unaffected by the annealing.

Figure 8:
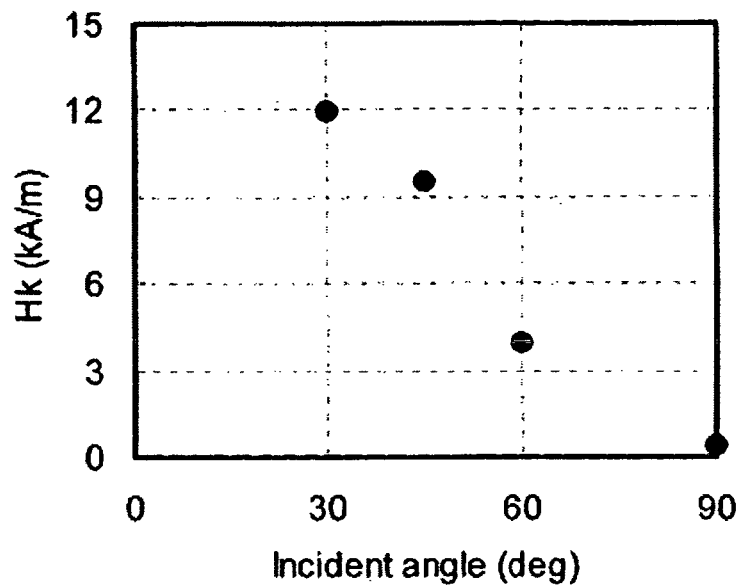
FIG. 8 is a diagram showing the relation between the anisotropy field of the free magnetic layer and an incident angle of sputtering particles.

FIG. 8 shows the relation between the anisotropy field of the $Co_{90}Fe_{10}$ (3 nm) free magnetic layer and the adhering particle incident direction when the free magnetic layer is formed. The adhering particle incident direction is perpendicular to the track width direction, and indicates the angle made by a line joining the sputtering target and the wafer center, with the wafer surface. The anisotropy field of the free magnetic layer increases, the shallower the incident angle of the adhering particles is relative to the wafer surface. A considerable increase of the anisotropy field is found when the incident angle is 60° or less, so the incident angle of the adhering particles when the free magnetic layer is formed is preferably set so that the angle relative to the wafer surface is 60° or less.

Figure 9:
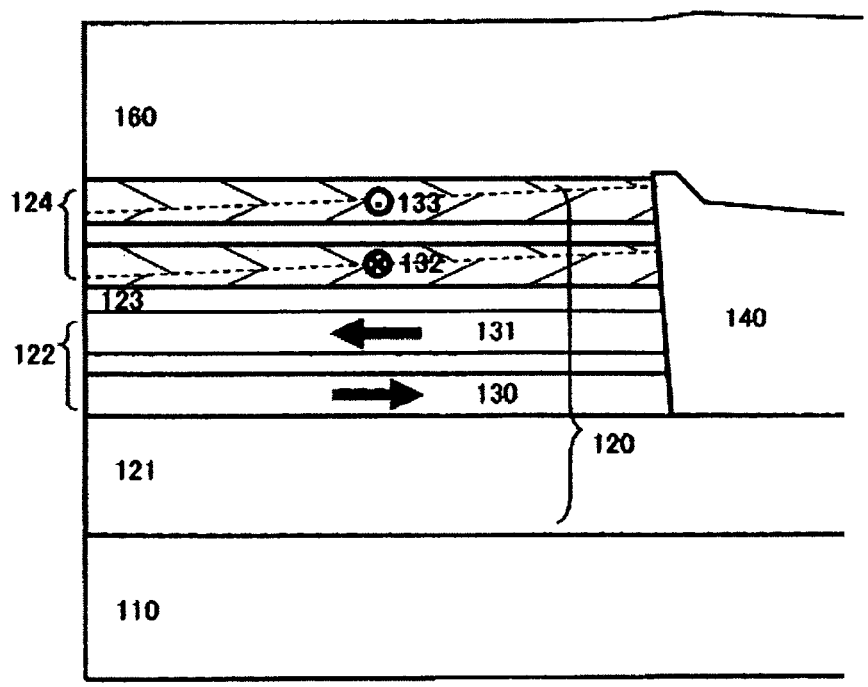
FIG. 9 is a cross-sectional view of a track center of the first aspect of the magneto-resistive head according to an embodiment of the present invention.
Figure 1:
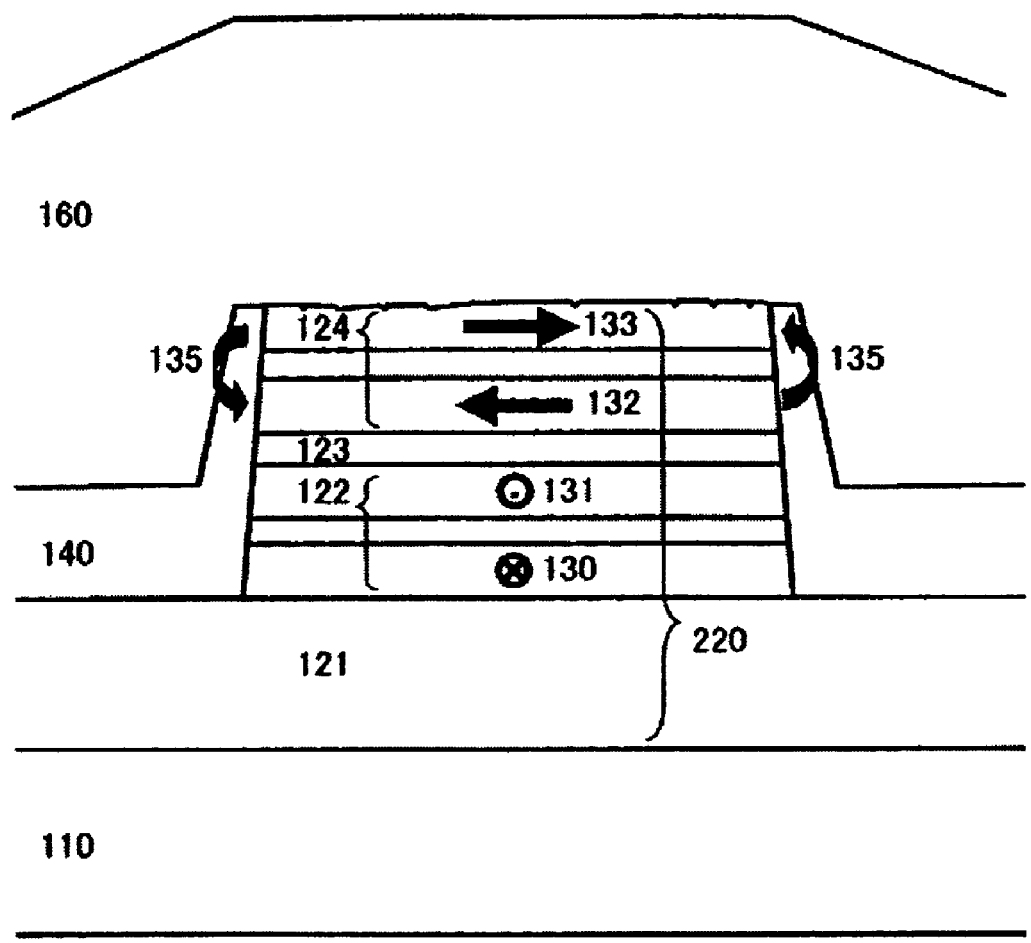
Figure 1:
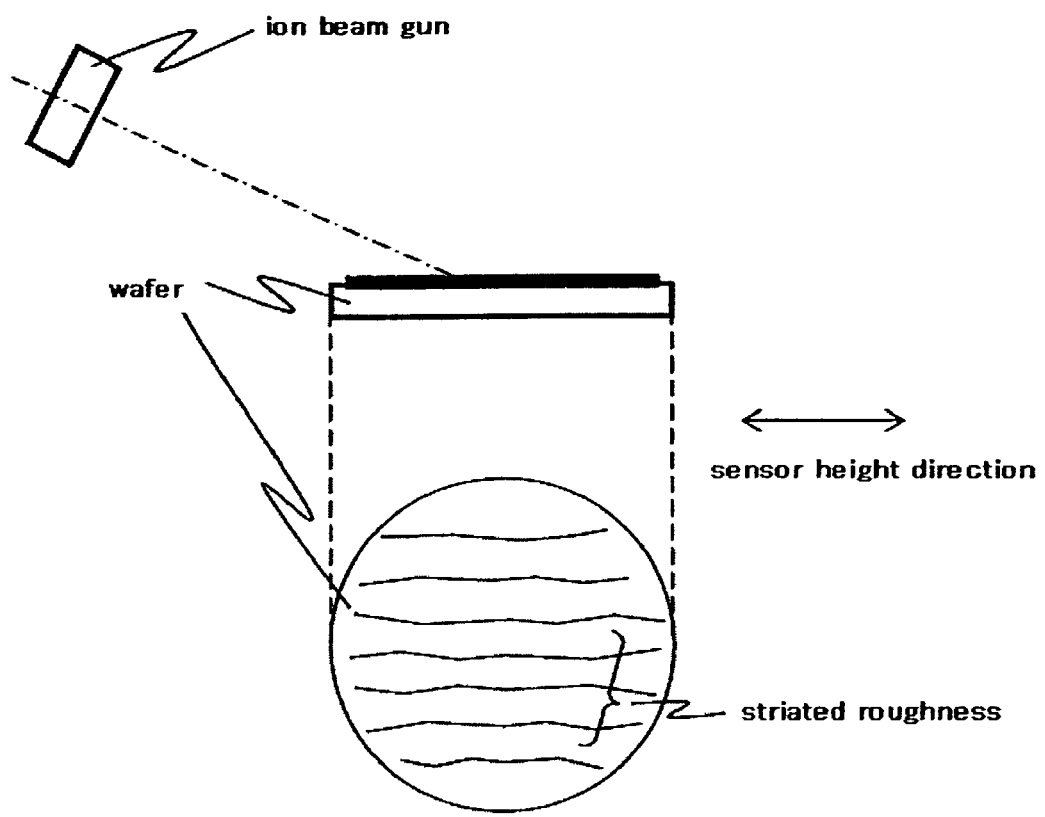
Figure 1:
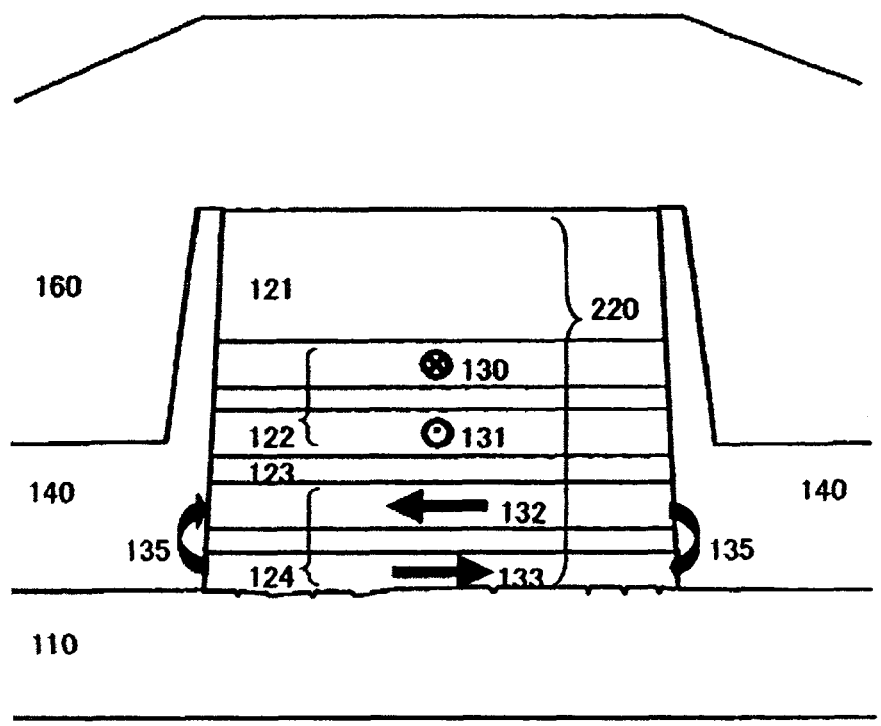
Figure 1:
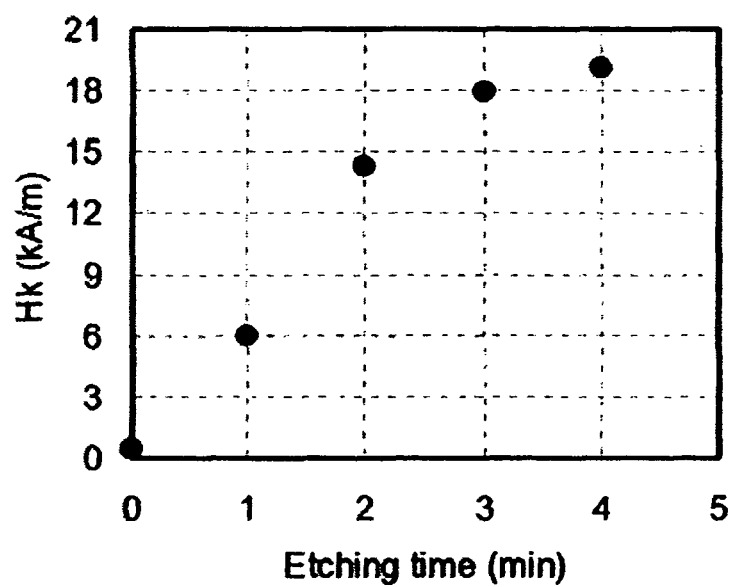

FIG. 9 shows the cross-sectional structure in the track center in FIG. 1 together with the features of this aspect described above. The left-hand end corresponds to the medium facing surface. The drawing shows the case where the crystal grains of the two magnetic layers forming the free magnetic layer 124 are perpendicular to the track width direction, and grow at an inclined angle relative to the wafer surface.

Next, the compositional elements of the magneto-resistive head shown in FIG. 1 in FIG. 9, will be described.

The wafer, lower shield 110, upper shield 160 and insulator film 140 are not particularly limited in the invention, so some examples of materials usually used in the art will now be given. The wafer may be AlTiC, SiC or these materials covered by $Al_2O_3$. The lower shield 110 and upper shield 160 may be a single layer or multilayer, such as a Ni—Fe alloy and nitrides thereof, or a Co—Zr, Co—Hf or Co—Ta amorphous alloy. These may be simply formed by sputtering or plating. The insulator film 140 uses $Al_2O_3$, $SiO_2$, AlN, SiN, or mixtures or multilayers thereof to prevent short-circuit of the lower shield 110 and upper shield 160. These are preferably simply formed by sputtering.

From the viewpoint of controlling film thickness and alloy composition and production efficiency, the magneto-resistive film 120 is preferably manufactured by sputtering. The film composition of the magneto-resistive film 120 may be for example: Ta(2.5)/$Ni_{47}Cr_{40}Fe_{13}$(3.5)/$Ni_{85}Fe_{15}$(1)/$Mn_{49}Pt_{51}$(14)/$Co_{90}Fe_{10}$(2)/Ru(0.45)/$Co_{90}Fe_{10}$(2)/Cu(3)/$Co_{90}Fe_{10}$(3)/Cu(0.6)/Ru(0.8)/$Co_{90}Fe_{10}$(3)/Cu(1)/Ta(5). Figures in brackets indicate film thickness, and the units are nm. The units of the alloy compositions indicated by elemental subscripts are at %. Ta(2.5)/Ni(3.5)/$Ni_{85}Fe_{15}$(1) is the under layer, $Mn_{49}Pt_{51}$(14) is the antiferromagnetic layer 121, $Co_{90}Fe_{10}$(2)/Ru(0.45)/$Co_{90}Fe_{10}$(2) is the pinning layer 122, Cu(3) is the intermediate layer 123, $Co_{90}Fe_{10}$(3)/Cu(0.6)/Ru(0.8)/$Co_{90}Fe_{10}$(3) is the free magnetic layer, and Cu(1)/Ta(5) is a protective layer, respectively. This composition example is that of a magneto-resistance film for a CPP-GMR head using a nonmagnetic conductive layer for the intermediate layer 123. The nonmagnetic conductive layer, apart from Cu, may be Ag or Au. It may also be a confined current path type wherein a very thin magnetic oxide ($Co_{90}Fe_{10}$(1)-Oxide) is inserted into the nonmagnetic conductive layer.

In the aforesaid construction, if the intermediate layer 123 is changed from a nonmagnetic conductive layer to a nonmagnetic tunneling barrier layer, the invention may be applied as a tunneling magneto-resistive film without modification. The nonmagnetic tunneling barrier layer may be Al(0.45)-Oxide or the like. Here, the significance of Al(0.45)-Oxide is that after forming an Al film, oxygen is introduced into the chamber, and an Al oxide film is formed using the "natural oxidation method". If control can be performed to suppress excessive oxidation, radical oxidation or plasma oxidation may also be used, an oxide film being formed by reactive sputtering or an $Al_2O_3$ film being formed directly. Apart from Al oxide, an oxide or nitride containing Mg, Al, Si, Ti, V, Mn, Zr, Nb, Hf or Ta may also be used.

Regarding the pinning layer 122 and free magnetic layer 124 which are component elements of the magneto-resistive film 120, a material containing Fe, Co or Ni (which have a high spin polarization ratio in the Fermi energy) as a principal component, may be disposed on the surface in contact with the intermediate layer 123 so that the resistance variation ratio, which has a large effect on reading output, increases. Also, it is more effective to use a Heusler alloy such as $Co_{50}Mn_{25}Ge_{25}$ or $Co_{50}Mn_{25}Si_{25}$, or a half metal such as $Fe_3O_4$, which have even larger spin polarization ratios. Of course, these may be used as a single layer film, or plural thereof may be used as a magnetic multilayer. Regarding the composition and film thickness of the free magnetic layer 124, care should be taken by suitable adjustments to reduce magnetostriction and coercivity.

The antiferromagnetic layer 121 is preferably an antiferromagnetic material having a large exchange coupling magnetic field, good thermal stability and high corrosion resistance. Apart from Mn—Pt, identical characteristics are obtained by using an ordered structure alloy represented by $Mn-M_1$ which contains Mn to the extent of 45 at % to 55 at %, and becomes antiferromagnetic when at least part undergoes a phase transformation to a Cu—AuI ordered structure by annealing at about 230-270° C., wherein $M_1$ comprises elements containing at least one of Ni, Ru, Rh, Pd, Re, Os, Ir and Pt. A disordered structure alloy antiferromagnetic film may also be used such as Mn—Ir which contains Ir to the extent of about 20 at %. After forming the magneto-resistive film 120, by performing annealing at about 230-270° C. for about 3 hours while applying a magnetic field in the sensor height direction, the magnetization of the pinning layer 122 can be fixed firmly in the sensor height direction.

In this aspect, as described above, a strong uniaxial anisotropy is imparted to the free magnetic layer which is unaffected by annealing due to the orientation of the crystal grain growth direction. Therefore, when the external magnetic field is zero, the magnetization of the free magnetic layer can be oriented spontaneously in the track width direction. The free magnetic layer 124 having a "synthetic antiferromagnetic structure" wherein the antiferromagnetic coupling is suitably adjusted, exhibits a linear response without any hysteresis as shown in FIG. 3 even if a longitudinal biasing field is not applied. Further, as seen from FIG. 1, the upper shield 160 is disposed at the track ends of the free magnetic layer via the insulator film 140. This may be used as a "side shield", and is advantageous for narrowing of the magnetic effective track width.

The invention may be extended to a "dual spin-valve structure" such as a first antiferromagnetic layer/first pinning layer/first intermediate layer/free magnetic layer/second intermediate layer/second pinning layer/second antiferromagnetic layer. This configuration makes it possible to obtain a higher output.

In FIG. 1, the antiferromagnetic layer 121 is not etched in the track width direction, and is patterned larger than the pinning layer 122/intermediate layer 123/free magnetic layer 124 part. When the magneto-resistive film 120 is etched, the aforesaid configuration can be manufactured by controlling the etching time while monitoring the etched particles using a mass spectrometer or the like. In a CPP magnetic head, parasitic resistance of materials having a high resistivity such as the antiferromagnetic layer, leads to a decrease of reading output. Therefore, by patterning the antiferromagnetic layer 121 larger than the track width as shown by the structure in the diagram, the antiferromagnetic layer 121 may be used as part of a lower electrode, which is effective for suppressing decrease of reading output. Here, a configuration was shown where the antiferromagnetic layer 121 was not etched, but part of the antiferromagnetic layer 121 may be etched in the film thickness direction, or conversely, a configuration may be adopted wherein in addition to the antiferromagnetic layer 121, part of the pinning layer 122, or the pinning layer 122 and part of the intermediate layer 123, are not etched in the film thickness direction. If the decrease of reading output due to parasitic resistance is small and sufficient reading output can be expected as in the case of a TMR head, patterning may be performed also in the track width dimension up to the lowermost surface of the antiferromagnetic layer 121 or part of the lower shield 110. As shown also in FIG. 9, an identical reasoning may be applied regarding the patterning configuration in the sensor height direction.

FIG. 10 is a schematic view from the medium facing surface of the magneto-resistive head according to a second aspect of an embodiment in accordance with the present invention. In this aspect, the magneto-resistive film 120 in the first aspect of the invention is replaced by a magneto-resistive film 220, the detailed structure of the head not being shown. The essential feature of this aspect is that it provides another method for imparting a strong uniaxial anisotropy to the free magnetic layer unaffected by annealing. In this aspect, it is important to form a striated roughness substantially parallel to the sensor height direction on at least one of the surface immediately prior to forming the free magnetic layer, and the topmost surface of the free magnetic layer. This roughness may be formed by irradiating and etching at least one of the surface immediately prior to forming the free magnetic layer and the topmost surface of the free magnetic layer, by setting an ion beam such as Ar, Kr, Xe to be oriented in an inclined direction relative to the wafer surface. FIG. 11 shows a schematic view of this method.

In order to obtain a satisfactory in-plane distribution of film thickness of the etched layer, the wafer may be given a half-turn when the etching is half completed. Also, the etching may be split not into two steps, but four or six steps. Due to the striated roughness effectively parallel to the sensor height direction, a strong uniaxial anisotropy wherein the track width direction is the axis of easy magnetization is induced in the free magnetic layer, and this uniaxial anisotropy is unaffected by annealing.

A similar effect is obtained even if the aforesaid roughness is formed midway during the process of forming the magnetic layer i/interlayer antiferromagnetic coupling layer/magnetic layer 2 forming the free magnetic layer, but in this case, care should be taken that the antiferromagnetic coupling characteristics via the interlayer antiferromagnetic coupling layer do not deteriorate. Also, as shown in FIG. 10, when the magneto-resistive film 220 is formed in the order antiferromagnetic layer 121/pinning layer 122/intermediate layer 123/free magnetic layer 124 from the wafer side, if the striated roughness is formed on the surface immediately prior to forming the free magnetic layer: intermediate layer 123, there is a risk that MR characteristics will deteriorate which is undesirable. Therefore, in this case, the striated roughness is desirably formed substantially parallel to the sensor height direction on the topmost surface of the free magnetic layer. On the other hand, as shown in FIG. 12, if the magneto-resistive film 220 is formed in the order free magnetic layer 124/intermediate layer 123/pinning layer 122/antiferromagnetic layer 121 from the wafer side, the under layer disposed underneath the free magnetic layer 124 may be etched. The method of forming a striated roughness substantially parallel to the sensor height direction may also be used in conjunction with the method of forming a film oriented in the crystal grain growth direction as described in the first aspect.

FIG. 13 shows the dependence of the anisotropy Hk in Ta (5 nm)/$Co_{90}Fe_{10}$ (3) on etching time. The surface of the Ta layer was etched under the conditions Ar: 75 sccm (0.17 Pa), accelerating voltage: 800 V, angle between Ar ion irradiation direction and wafer surface: 25°. The etching rate was approximately 0.3 nm/min. As is clear from the diagram, by etching the surface of the Ta layer under these conditions, the anisotropy field greatly increases.

In this aspect also, as in the first aspect, the free magnetic layer 124 has the construction: first magnetic layer/interlayer antiferromagnetic coupling layer/second magnetic layer, the magnetizations of the two magnetic layers have an antiparallel alignment due to antiferromagnetic interlayer coupling via the interlayer antiferromagnetic coupling layer and the magnetic layers have identical magnetization amounts, so the magnetizations effectively cancel each other out. Also, to obtain the dual objectives of stability and sensitivity in reading characteristics, the magnitude of the antiferromagnetic coupling must be adjusted. The details are identical to those of the first aspect, and will not be repeated. In this case also, even if a longitudinal biasing field is not applied, the free magnetic layer 124 shows a linear response without hysteresis as shown in FIG. 3, and highly stable reading characteristics are obtained.

Figure 14:
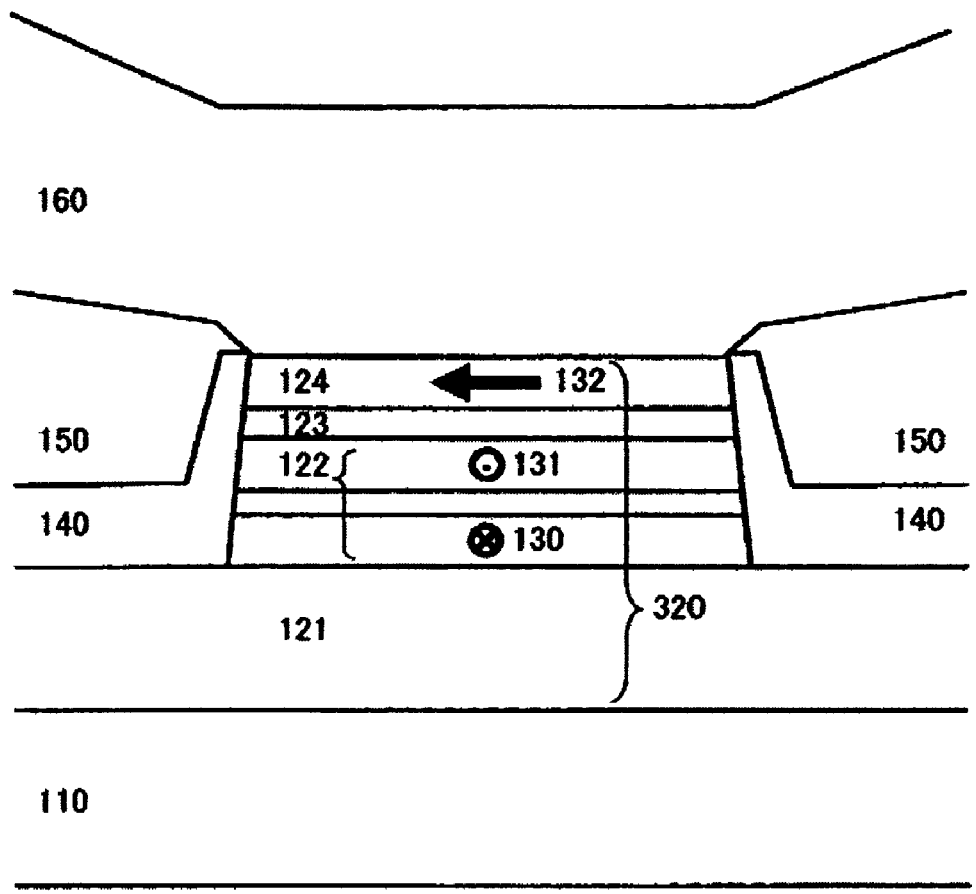
FIG. 14 is a schematic view from a medium facing surface of a third aspect of the magneto-resistive head according to an embodiment of the present invention.
Figure 1:
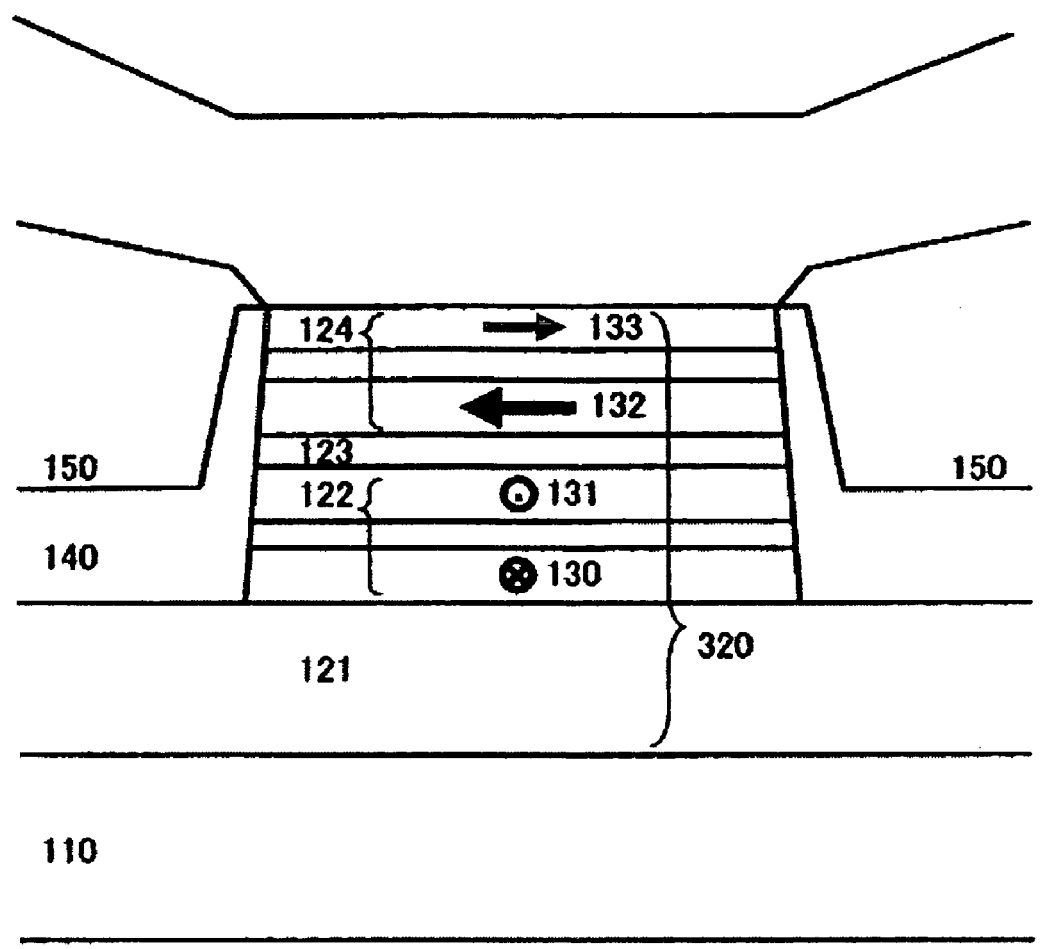
Figure 16:
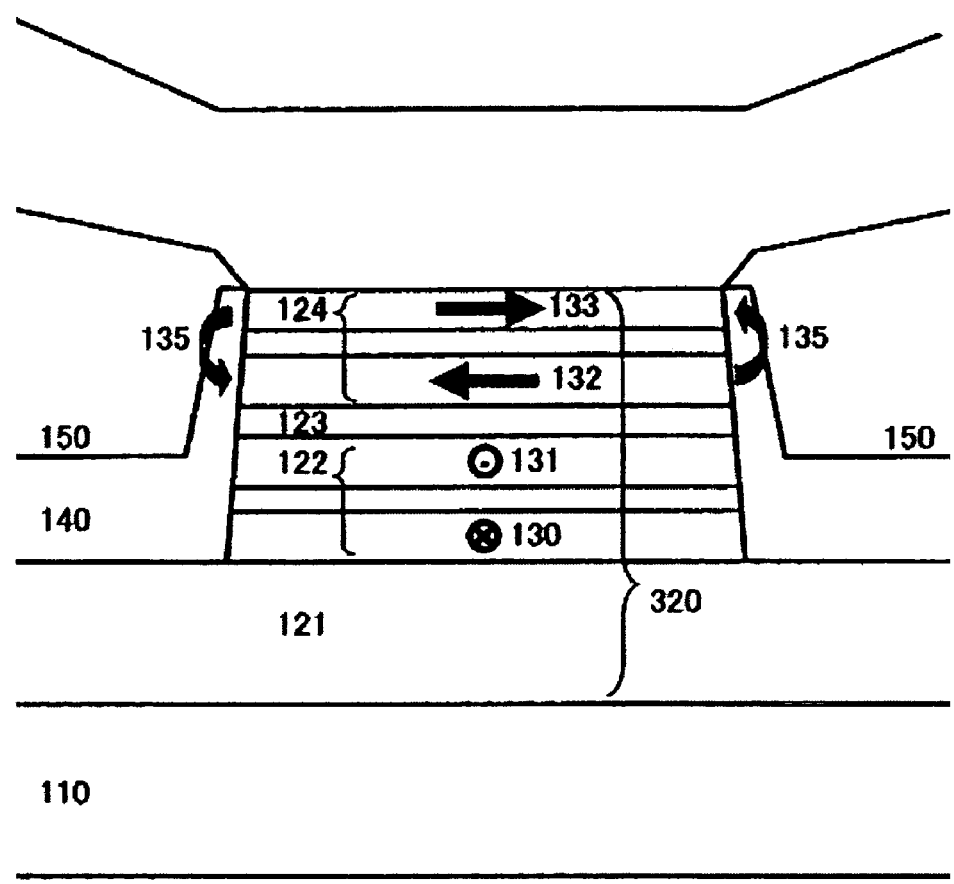
FIG. 16 is a schematic view from a medium facing surface of the third aspect having another form of magneto-resistive head according to an embodiment of the present invention.
Figure 1:
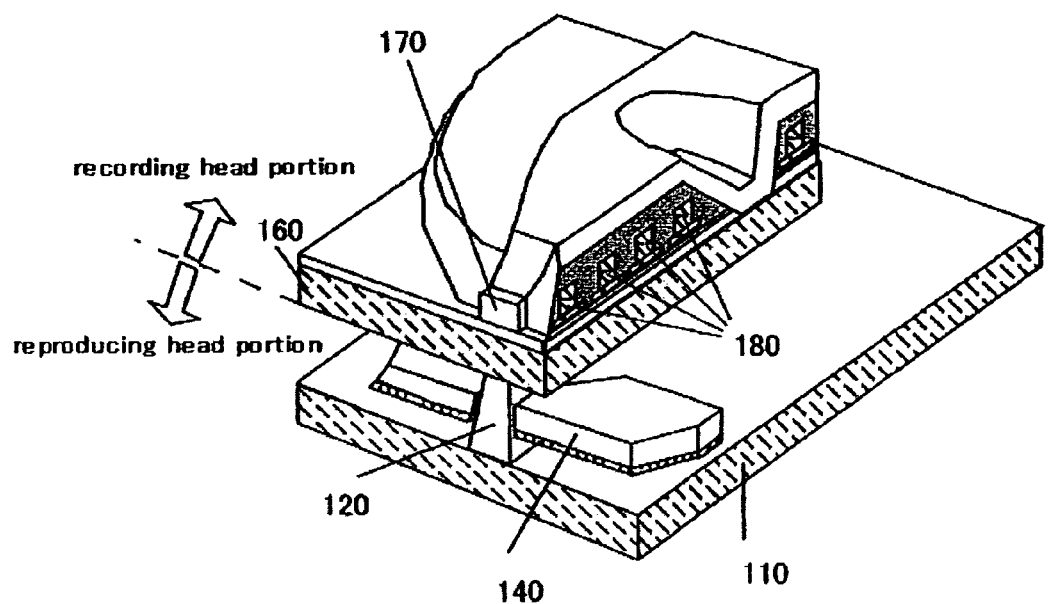
Figure 1:
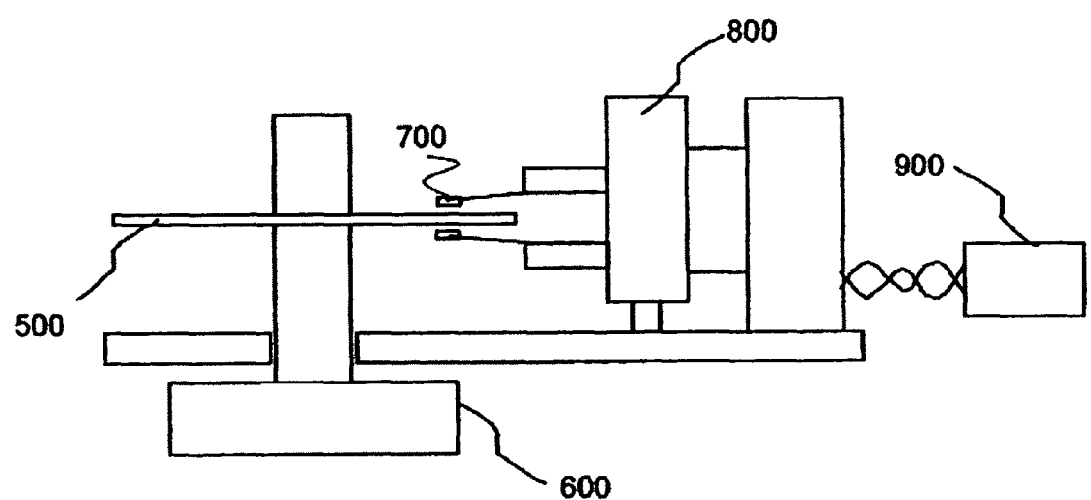

The method for inducing a strong uniaxial anisotropy in the free magnetic layer according to an embodiment of the present invention may be applied without modification to a magneto-resistive head having a hard bias structure. FIG. 14 is a schematic view from the medium facing surface of a magneto-resistive head according to a third aspect of an embodiment in accordance with the present invention. Here, the insulator film 140/hard magnetic film 150 is formed using the lift-off method at both ends of a magneto-resistive film 320. By using at least one of the film-forming method for forming the free magnetic layer to be oriented in the crystal grain growth direction as described in the first aspect, and the method of forming of the striated surface roughness antiparallel to the sensor height direction as described in the second aspect, a strong uniaxial anisotropy can be imparted to the free magnetic layer which is unaffected by annealing. Therefore, when the external magnetic field is zero, the magnetization of the free magnetic layer is spontaneously oriented in the track width direction, and since the anisotropy field is large, a linear response is obtained relative to a wide signal magnetic field range. Hence, if a longitudinal biasing field of the minimum magnitude which reduces the effect of the magnetic field at the track ends of the free magnetic layer is applied, highly stable reading characteristics can be obtained. In FIG. 14, the free magnetic layer 124 is drawn as a single layer, but it may have a synthetic ferrimagnetic structure as shown in FIG. 15, or a synthetic antiferromagnetic structure as shown in FIG. 16.

FIG. 17 shows a schematic view of a magneto-resistive head applying an embodiment in accordance with the present invention. In the aforesaid method, after manufacturing the magneto-resistive head (read head), the details will be omitted, but a write head mainly comprising a pole 170 and coils 180 is manufactured. The write head may be used for longitudinal magnetic recording or perpendicular magnetic recording. Alternatively, the write head may be manufactured first, and a magneto-resistive head (read head) manufactured thereupon. After the wafer process is complete, a cutting process, air bearing surface-forming process and assembly process are performed, and when these are incorporated into a magnetic storage system, information can be written/read to and from a magnetic recording medium.

FIG. 18 is a schematic view of a magnetic storage system according to an embodiment of the present invention. A magnetic recording medium 500 on which information is magnetically recorded is rotated by a spindle motor 600, and a head slider 700 is moved over a track of the magnetic recording medium 500 by an actuator 800. In this magnetic storage system, a read head and write head formed on the head slider 700 are moved relative to each other in close contact with a desired position on the magnetic recording medium 500, and signals are thereby read/written sequentially. A write signal is written on the magnetic recording medium 500 by the write head via a signal processing system 900, the write signal written on the magnetic recording medium 500 is electromagnetically converted by the read head, and is then obtained as an electrical signal via the signal processing system 900. In order to move the head slider 700 to a desired recording track of the magnetic recording medium 500, a position signal on the track is detected by the read head, and positioning is performed by controlling the actuator 800. In the diagram, the case is shown where a write signal is written on both surfaces of the magnetic recording medium 500 and there are two head sliders 700, but the write signal may be recorded on only one surface of the magnetic recording medium 500, in which case only one head slider 700 is installed. Also, only one magnetic recording medium 500 was shown, but plural media may be installed.

In the magnetic head and magnetic storage system using this head according to embodiments of the present invention described above, highly reliable read characteristics can be obtained with high sensitivity.

What is claimed is:

1. A magneto-resistive head, comprising:
a magneto-resistive film including a pinned magnetic layer wherein the magnetization is fixed in the sensor height direction, a free magnetic layer whose magnetization direction varies according to an external magnetic field, and an intermediate layer laminated between said pinned magnetic layer and said free magnetic layer; and
a pair of electrodes for passing a sensing current, wherein:
said free magnetic layer has a laminated structure including a first magnetic layer, an interlayer antiferromagnetic coupling layer and a second magnetic layer,
said first magnetic layer and said second magnetic layer have approximately equal magnetic moments, and
at least one of said first magnetic layer and said second magnetic layer has a uniaxial anisotropy wherein a track width direction is an axis of easy magnetization, due to the orientation of the growth direction of the crystal grains.

2. The magneto-resistive head according to claim 1, wherein, when the external magnetic field is zero, the magnetization of said first magnetic layer and said second magnetic layer have an antiparallel alignment in a substantially parallel direction to the track width direction, the effective net magnetic moment of said free magnetic layer is effectively zero, and the magnetizations of said first magnetic layer and said second magnetic layer shift between a symmetrically antiparallel alignment and a parallel alignment according to a signal magnetic field.

3. The magneto-resistive head according to claim 1, wherein said interlayer antiferromagnetic coupling layer comprises a nonmagnetic layer selected from any of Ru, Re, Cr, Ir, or a film stack including a first nonmagnetic layer selected from any of Ru, Re, Cr, Ir and a second nonmagnetic layer selected from any of Cu, Ag, Au.

4. The magneto-resistive head according to claim 1, wherein said interlayer antiferromagnetic coupling layer is a film stack comprising Ru having a film thickness of 0.7 to 0.9 nm, and Cu having a film thickness of 0.7 nm or less.

5. The magneto-resistive head according to claim 1, wherein said interlayer antiferromagnetic coupling layer comprises an alloy having at least one of the elements Ru, Re, Cr, Ir, Cu as its principal component.

* * * * *